(12) United States Patent
Kojima et al.

(10) Patent No.: US 8,211,500 B2
(45) Date of Patent: Jul. 3, 2012

(54) COPPER FILM DEPOSITION METHOD

(75) Inventors: Yasuhiko Kojima, Tokyo-To (JP); Naoki Yoshii, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 1242 days.

(21) Appl. No.: 10/591,476

(22) PCT Filed: Feb. 25, 2005

(86) PCT No.: PCT/JP2005/003155
§ 371 (c)(1),
(2), (4) Date: Sep. 1, 2006

(87) PCT Pub. No.: WO2005/083152
PCT Pub. Date: Sep. 9, 2005

(65) Prior Publication Data
US 2007/0197398 A1    Aug. 23, 2007

(30) Foreign Application Priority Data
Mar. 1, 2004  (JP) ................................. 2004-056628

(51) Int. Cl.
*C23C 16/00* (2006.01)
(52) U.S. Cl. .................. 427/250; 427/252; 427/255.15; 427/255.23; 427/255.7
(58) Field of Classification Search ................ 427/252
See application file for complete search history.

(56) References Cited

U.S. PATENT DOCUMENTS

| | | | |
|---|---|---|---|
| 3,198,167 A | 8/1965 | Bakish et al. | |
| 4,321,073 A | 3/1982 | Blair | |
| 6,464,779 B1 * | 10/2002 | Powell et al. | 117/89 |
| 6,716,744 B2 | 4/2004 | Pan et al. | |
| 6,849,122 B1 * | 2/2005 | Fair | 117/89 |
| 2001/0002280 A1 * | 5/2001 | Sneh | 427/255.28 |
| 2002/0013487 A1 * | 1/2002 | Norman et al. | 556/7 |
| 2003/0129308 A1 * | 7/2003 | Chen et al. | 427/255.28 |
| 2004/0009665 A1 | 1/2004 | Chen et al. | |

FOREIGN PATENT DOCUMENTS

| | | |
|---|---|---|
| JP | 63-5424 | 2/1988 |
| JP | 2003-138378 | 5/2003 |
| JP | 2003-193233 | 7/2003 |

(Continued)

OTHER PUBLICATIONS

Krupoder et al. "Polyfluorocarboxylate. Copper(ii) trifluoroacetate and its analogues" Journal of Fluorine Chemistry. 73, 1995, p. 13-15.*

(Continued)

*Primary Examiner* — Timothy Meeks
*Assistant Examiner* — Mandy Louie
(74) *Attorney, Agent, or Firm* — Smith, Gambrell & Russell, LLP

(57) ABSTRACT

A Cu film is deposited on a substrate by ALD (Atomic Layer Deposition) process, in which: a Cu-carboxyl acid complex or a derivative thereof having a high vapor pressure and wettability to a base is used in a gasified state; $H_2$ is used as a reductive gas; and a step of adsorbing a source material gas to a substrate and a step of forming a Cu film by reducing the adsorbed gas with a reductive gas are repeated alternately. With this method, a conformal Cu film having excellent quality can be formed.

11 Claims, 3 Drawing Sheets

FOREIGN PATENT DOCUMENTS

| JP | 2004-6856 | 1/2004 |
| WO | 2005/058789 | 6/2005 |

OTHER PUBLICATIONS

Notification of Transmittal of Translation of the International Preliminary Report on Patentability (Form PCT/IB/338)—PCT/JP2005/003155, dated Jan. 2004.

PCT International Preliminary Report on Patentability (Form PCT/IB/373)—PCT/JP2005/003155, dated Jan. 2004.

Translation of PCT Written Opinion of the International Searching Authority—(Form PCT/ISA/237)—PCT/JP2005/003155, dated Jan. 2004.

Supplementary European Search Report (Application No. EP 04 74 6795).

Mouche M-J et al., "Metal-organic chemical vapor deposition of copper . . . precursor", Thin Solid Films, Elsevier-Sequoia S.A. Lausanne, CH, vol. 262, 1995, pp. 1-6, XP002347082, ISSN: 0040-6090.

Per Martensson et al., "Growth and Selectivity in the Cu(II)—2,2,6,6-tetramethyl-3,5-heptanedionate/$H_2$ Process", Journal of the Electrochemical Society, 1998, vol. 145, No. 8, pp. 2926-2931.

Mikko Utriainen, et al., Studies of metallic thin film growth in an atomic layer epitaxy reactor using $M(acac)_2$ (M=Ni, Cu, Pt) precursors, Applied Surface Science, 2000, vol. 157, pp. 151-158.

* cited by examiner

COPPER FILM DEPOSITION METHOD

TECHNICAL FIELD

The present invention relates to a method of depositing a copper (Cu) film, and more specifically to a method of depositing a copper film on a semiconductor substrate.

BACKGROUND ART

In response to higher operating speed of semiconductor devices and miniaturization of wiring patterns, copper having higher conductivity and electromigration resistance than aluminum now draws attention as a wiring material As a method of forming a Cu film, there has been known CVD (chemical vapor deposition) processes that deposit a Cu film on a substrate through a thermal decomposition reaction of a source material gas containing Cu or a reduction reaction of a source material gas containing Cu. Cu films formed by the CDV processes show excellent coverage performance and excellent performance of filling up fine and deep patterns, and therefore can advantageously be used for forming fine wiring patterns.

As one of CVD processes, there has been known an ALD (Atomic Layer Deposition) process capable of forming a Cu film with excellent quality. In the ALD process, a Cu film with a desired thickness is obtained by repeating a step of adsorbing a source material gas to a base layer with a thickness of a molecular (atomic) layer level, and a step of reacting the adsorbed source material gas with a reductive gas thereby forming a Cu film (Refer to, for instance, JP 2004-6856A).

There has been known the use of a β-diketone complex or a derivative thereof as a source material (Refer to, for instance, JP 2003-138378A) in forming a Cu film by a CVD process. If a film is formed by a ALD process by using the β-diketone complex as a source material, since the vaporized β-diketone complex has low wettability to a base layer, aggregation of the β-diketone complex may occur when adsorbing it to the base layer. Furthermore, since the nuclear density of Cu is low in the early stage of film formation, a Cu film having a rough surface is formed. Therefore, it is difficult to form an extremely thin Cu film.

The reduction reaction with the use of a reductive gas takes a long time. Thus, it is desirable to shorten the reduction-step time for improving the total throughput of the entire film-forming process. However, if the reduction-step time is shortened, impurities such as carbon originated from the source material gas are generated on an interface between the base layer and the Cu film, and the Cu film is easily affected by oxidization of the base layer, and therefore the adhesion of the Cu film to the base layer becomes lower and the surface roughness of the film becomes disadvantageously remarkable. It is thus difficult to achieve both improvement of the throughput by shortening the reduction-step time and improvement of the film quality.

DISCLOSURE OF THE INVENTION

The present invention has been made in view of the foregoing circumstances, and it is therefore an object of the present invention to provide a film deposition method capable of forming a Cu film having excellent quality.

Another object of the present invention is to provide a film deposition method that achieves both improvement in throughput of a film deposition process, and reduction in roughness of a Cu film and improved adhesion of the Cu film to a base layer.

In order to achieve the above objective, according to the first aspect of the present invention, there is provided a film deposition method for forming a Cu film on a substrate by a CVD by using a source material containing a Cu-carboxylic acid complex or a derivative thereof.

According to the second aspect of the present invention, there is provided a film deposition method including the steps of: supplying a source material including a Cu-carboxylic acid complex or a derivative thereof onto a substrate; and supplying a reductive gas to the substrate after stopping supplying the source material, wherein the step of supplying the source material and the step of supplying the reductive gas are performed alternately.

According to the third aspect of the present invention, there is provided a film deposition method including the steps of: placing a substrate in a process container; and repeating the following steps (a) to (d): (a) supplying a source material including a Cu-carboxylic acid complex or a derivative thereof onto the substrate; (b) removing residual gases in the process container therefrom after stopping supplying the source material; (c) supplying a reductive gas to the substrate; and (d) removing residual gases in the process container therefrom after stopping supplying the reductive gas.

According to the forth aspect of the present invention, there is provided a film deposition method that alternately performs a step of supplying a Cu-containing source material onto a substrate and a step of supplying a reductive gas to the substrate after stopping supplying the Cu-containing source material, wherein said method has: a first film deposition period in an early deposition stage in which the two steps are performed alternately and each of the steps of supplying the reductive gas is performed for a first period of time T1; and a second film deposition period following the first film deposition period in which the two steps are performed alternately and each of the steps of supplying the reductive gas is performed for a second period of time T2 shorter than the period of time T1.

According to the fifth aspect of the present invention, there is provided a film deposition method including the steps of: placing a substrate in a process container; and repeating the following steps (a) to (d): (a) supplying a Cu-containing source material onto the substrate; (b) removing residual gases in the process container therefrom after stopping supplying the Cu-containing source material; (c) supplying a reductive gas to the substrate; and (d) removing residual gases in the process container therefrom after stopping supplying the reductive gas, wherein said method has: a first film deposition period in an early deposition stage in which the steps (a) to (d) are performed alternately and each of the steps of supplying the reductive gas is performed for a first period of time T1; and a second film deposition period following the first film deposition period in which the steps (a) to (d) are performed alternately and each of the steps of supplying the reductive gas is performed for a second period of time T2 shorter than the period of time T1.

In the third and fifth aspects of the present invention, the step (b) or the step (d) may be performed by replacing the atmosphere in the process container with an inert gas or evacuating the process container.

In the second to fifth aspects of the present invention: the reductive gas may be converted into radicals by using plasma when supplied to the substrate; and $H_2$ gas may be used as the reductive gas. In the first to third aspects of the present invention, the source material may contain copper trifluoroacetate.

In the fourth and fifth aspects of the present invention, it is preferable that the first deposition period continues until a continuous Cu film is formed on the substrate and the second period continues until a thickness of the Cu film deposited on the substrate reaches a predetermined value. The first period of time T1 may be in the range of 3 to 20 seconds, and the second period of time T2 may be in the range of 1 to 5 seconds.

In the first to third aspects of the present invention, since the Cu-calboxylic acid complex or a derivative thereof used as a source material has a high vapor pressure, the adsorbing step can be performed by using a source material gas having a high concentration. Such a source material gas has high wettability to a base. Thus, it is possible to form a continuous, smooth Cu film with high quality, even if the film thickness is small. In addition, since the Cu-calboxylic acid complex or a derivative thereof has high polarity and thus is adsorbed to a substrate efficiently, the film deposition rate is high. Furthermore, Cu-calboxylic acid complex or a derivative thereof can be readily produced, and the cost is advantageously low. In the second and third aspects of the present invention, since an ALD process is employed, a film having excellent quality and film-thickness accuracy can be obtained.

In the fourth and fifth aspects of the present invention, the period of time for the reduction reaction with the use of a reductive gas, preferably radicals thereof, performed in the early stage of the film deposition is set relatively long so as to prevent negative effects of impurities such as carbon originated from the source material which appear on an interface between the base and the Cu film or prevent negative effects of oxidization of the base, whereby a continuous Cu film with excellent quality is formed; and the period of time for the reductive reaction with the use of a reductive gas, preferably a radical thereof, performed in the later stage of the film deposition is set relatively short, whereby the time required for the later stage of the film deposition is shortened. Due to the above, the time required for the entire film deposition process can be shortened regardless of the type of the Cu-containing source material, and thus both improvement of quality of a Cu film formed by the ALD process and improvement of the throughput of the process can be achieved.

Furthermore, the present invention provides a storage medium in which software executable by a control computer of a film deposition system is stored. Upon execution of the software, the control computer controls the film deposition system to perform the foregoing film deposition methods.

DESCRIPTION OF REFERENCE SIGNS

Figure 1:
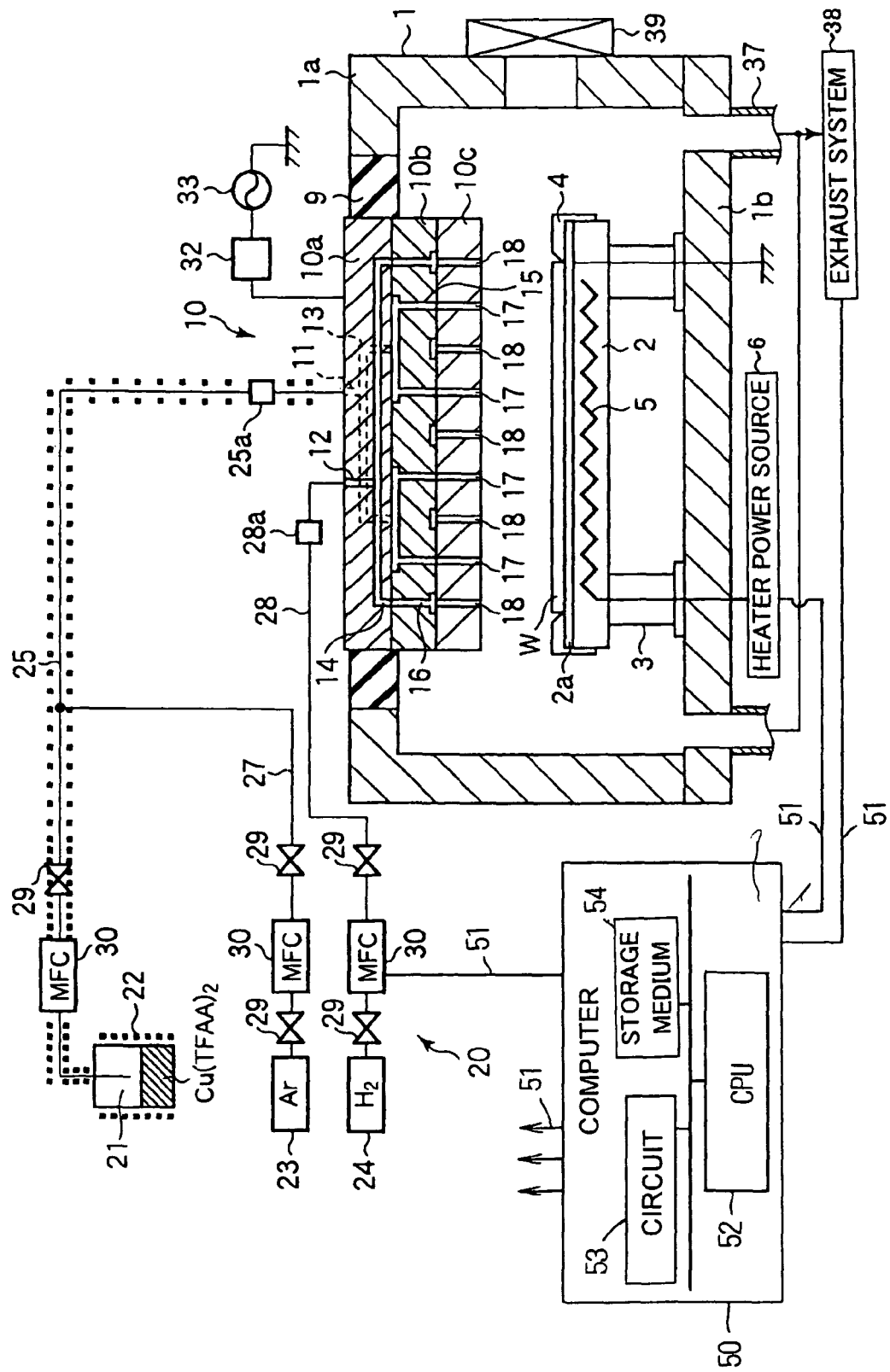
FIG. 1 is a cross-sectional view schematically showing the configuration of a film deposition system used for carrying out the present invention.

1 . . . Chamber
2 . . . Susceptor
2a . . . Lower electrode
3 . . . Supporting member
5 . . . Heater
10 . . . Shower head
20 . . . Gas supply mechanism
21, 41: . . . Cu-containing material source
22 . . . Heater
23 . . . Ar gas source
24 . . . $H_2$ gas source
25, 27, 28, 44 . . . Gas line
45 . . . Vaporizer
50 . . . Computer (System controller)
54 . . . Storage medium
S1, S11, S12 . . . Source material supplying step
S2, S12, S22 . . . Source material supply stopping and residual gas removing step
20 S3, S13, S23 . . . Reductive gas supplying step
S4, S14, S24 . . . Reductive gas supply stopping and residual gas removing step
W . . . Wafer

BEST MODE FOR CARRYING OUT THE INVENTION

An embodiment of the present invention will be described with reference to the attached drawings.

As shown in FIG. 1, a film deposition system has a substantially-cylindrical, air-tight chamber 1. In the chamber 1, a susceptor 2 for supporting a wafer W as a process object in a horizontal posture is supported by a cylindrical supporting member 3. A guide ring 4 for guiding the wafer W is provided on a peripheral portion of the susceptor 2. A heater 5 is embedded in the susceptor 2, and is connected to a heater power source 6 for heating the wafer W to a predetermined temperature. A grounded lower electrode 2a is provided in the susceptor 2.

A shower head 10 is provided on a ceiling 1a of a chamber 1 via an insulating member 9. The shower head 10 includes an upper block body 10a, an intermediate block body 10b, and a lower block body 10c. In the lower block body 10c, exhaust holes 17 and 18 each for discharging a gas are formed alternately. On a top surface of the upper block body 10a, a first gas inlet port 11 and a second gas inlet port 12 are provided. In the upper block body 10a, a number of gas passages 13 are branched from the first gas inlet port 11. A gas passage 15 is provided in the intermediate block body 10b, and the gas passage 13 is communicated with the gas passage 15. The gas passage 15 is communicated with an exhaust hole 17 in the lower block body 10c. In the upper block body 10a, a number of gas passages 14 are branched from the second gas inlet port 12. A gas passage 16 is formed in the intermediate block body 10b, and the gas passage 14 is communicated with the gas passage 16. The gas passage 16 is communicated with an exhaust hole 18 in the lower block body 10c. The first gas inlet port 11 and the second gas inlet port 12 are connected to a gas line of the gas supply mechanism 20.

The gas supply mechanism 20 has a Cu-containing material source 21 for supplying a source material containing Cu such as a Cu-carboxyl acid like copper trifluoroacetate (Cu(TFAA)$_2$), an Ar gas source 23 for supplying Ar gas as a carrier gas, and a $H_2$ gas source 24 for supplying $H_2$ gas as a reductive gas.

A gas line 25 is connected to the Cu-containing material source 21. A gas line 27 joined with the line 25 is connected to the Ar gas source 23. A gas line 28 is connected to the $H_2$ gas source 24. In the gas line 25, a mass-flow controller 30 and a valve 29 located on the downstream side of the controller 30 are provided. In each of the gas lines 27 and 28, two valves 29 and a mass-flow controller 30 interposed between the valves 29 are provided The Cu-containing material source 21 and the gas line 25 connected thereto are heated to a temperature not higher than 200° C., preferably to a temperature not higher than 150° C. The Cu-carboxyl acid complex $(Cu(RCOO)_2)$ used as a Cu source material is in a solid state at the room temperature and under the atmospheric pressure. When the Cu-containing material source 21 and the gas line 25 are heated by the heater 22 and the chamber 1 is evacuated, the Cu-carboxyl acid complex whose sublimation temperature is 150° C. under the atmospheric pressure sublimates, so that the Cu-carboxyl acid complex can be supplied in a gaseous state.

The gas line 25 extending from the Cu-containing material source 21 is connected via the insulator 25a to the first gas inlet port 11. The gas line 28 extending from the $H_2$ gas source 24 is connected via an insulator 28a to the second gas inlet port 12.

Therefore, during a film deposition process, a Cu-containing source material gas supplied from the Cu-containing material source 21 is carried by the Ar gas supplied from the Ar gas source 23 through the gas line 27, flows from the first gas inlet port 11 of the shower head 10 via the gas line 25 into the shower head 10, flows through the gas passages 13 and 15, and discharged from the exhaust hole 17 into the chamber 1. In the embodiment shown in FIG. 1, Ar gas as a carrier gas is supplied from the gas line 27 connected to the gas line 25. A carrier gas line, however, may be provided in the Cu-containing material source 21 to supply the carrier gas.

The $H_2$ gas supplied from the $H_2$ gas source 24 flows from the second gas inlet port 12 via the gas line 28 into the shower head 10, passes through the gas passages 14 and 16, and is discharged from the exhaust port 18 into the chamber 1.

A radio-frequency power source 33 is connected via a matching box 32 to the shower head 10. A radio-frequency power is supplied from the radio-frequency power source 33 to be applied across the shower head 10 and the lower electrode 2a, whereby the $H_2$ gas supplied as a reductive gas via the shower head 10 into the chamber 1 is converted into plasma.

An exhaust pipe 37 is connected to a bottom wall 1b of the chamber 1, and an exhaust system 38 is connected to the exhaust pipe 37. By operating the exhaust system 38, the interior of the chamber 1 can be evacuated to a predetermined degree of vacuum. A gate valve 39 is provided on a side wall of the chamber 1. When the gate valve 39 is opened, the wafer W can be carried into or out of the chamber 1.

Functional components of the film deposition system are connected via a signal line 51 to a control computer 50 which automatically controls the entire film deposition system. The functional components as used herein are not limited to the heater power source 6, a heater power source (not shown) for supplying a power to the heater 22, the valve 29, the mass flow controller 30, the radio-frequency power source 33, and the exhaust system 38, and include all components that operate for achieving predetermined process conditions. For the simplicity of the drawing, only some of many signal lines 51 are shown. Also in the embodiment shown in FIG. 3, all of the functional components are connected to the control computer 50, and operate according to instructions sent from the control computer 50. The control computer 50 is typically a general-purpose computer capable of achieving any functions depending on software to be executed.

The control computer 50 has a central processing unit (CPU) 52, a circuit 53 for supporting the CPU, and a storage medium 54 storing the control software. The control computer 50 controls each of the functional components of the film deposition system such that the components achieve various process conditions (such as a gas flow rate, process pressure, process temperature, and radio-frequency power) defined in a predetermined process recipe.

The storage medium 54 may be fixedly provided in the control computer 50, or may be detachably set in a reader provided in the control computer 50 so that the program stored in the medium 54 can be read out by the reader. In the most typical embodiment of the present invention, the storage medium 54 is a hard disk drive in which the control software is installed by a service man of a manufacturer of the film deposition system. In another embodiment, the storage medium 54 is a removable disk such as a CD-ROM or a DVD-ROM with control software written therein, and the removable disk is read by an optical reader provided in the control computer 50. The storage medium 54 may be either a RAM (Random Access Memory) or a ROM (Read Only Memory), or a cassette ROM. In brief, any components known in the computer technology can be used as the storage medium 54. In a factory where a plurality of film deposition systems is installed, the control software may be stored in an administrative computer for controlling the control computers 50 of the film deposition systems. In this case, each of the film deposition systems is controlled by the administrative computer via a communication line to perform a required process.

A process of depositing a Cu film on a wafer W in the film deposition system will be described with reference to FIG. 2.

When performing the film deposition process, at first, the wafer W is heated by the heater 5 up to a temperature in the range of 50 to 350° C., preferably to a temperature in the range of 50 to 200° C. Then, the chamber 1 is evacuated by the exhaust system 38 to maintain the pressure in the chamber 1 in the range of 10 to 1400 Pa, preferably 10 to 500 Pa.

A Cu-carboxyl acid complex or a derivative thereof such as $(Cu(TFAA)_2)$ (*TFAA=TriFluoroacetic Acid Anhydride) is used as a Cu-containing source material, and the source material is gasified in the Cu-containing material source 21 and is supplied into the chamber 1 for a period of time in the range of 0.1 to 5 seconds at a flow rate in the range of, for instance, 0.01 to 1 g/min. In the chamber 1, the source material adsorbs to the entire surface of the wafer W that has been heated to a temperature at which the Cu-containing source material is not decomposed, namely, for instance, to a temperature of 400° C. or below, preferably to 350° C. or below, and more preferably to a temperature of 200° C. or below (Source material supplying step S1).

Then, the supply of the source material gas is stopped, and the chamber 1 is evacuated to remove the surplus source material gas remaining in the chamber 1 (Source material supply stopping and residual gas removing step S2). In this step, the residual gas may be removed by evacuating the chamber 1 with an inert gas as a purge gas being supplied into the chamber 1 to purge the same. An inert gas other than Ar gas such as $N_2$ gas or He gas may be used as the purge gas; and $H_2$ gas may be used as the purge gas.

Then, the $H_2$ gas as a reductive gas is supplied from the $H_2$ gas source 24 at a flow rate in the range of, for instance, 100 to 5000 ml/min, and a radio-frequency power in the range of 50 to 2000 W, preferably 100 to 1000 W is supplied from the high frequency power source 33. A frequency of the radio-frequency power is, for instance, 13.56 MHz, but the frequency is not limited to this value. When the radio-frequency power is supplied, the $H_2$ gas is converted into plasma so that hydrogen radicals ($H_2$*) are generated, and the copper trifluoroacetate $(Cu(TFAA)_2)$ absorbing to the surface of the wafer W is reduced by the hydrogen radicals ($H_2$*) through the reaction expressed by the following reaction formula (Reductive gas supply step S3):

This step S3 is continued for a period of time in the range of, for instance, 1 to 5 seconds.

Then, the supply of $H_2$ gas and the application of radio-frequency power are stopped, and the interior of the chamber 1 is evacuated to remove the $H_2$ gas from the chamber 1 (Reductive gas supply stopping and residual gas removing step S4). In this step, the residual gas may be removed by evacuating the chamber 1 with an inert gas as a purge gas being supplied into the chamber 1 to purge the same. As previously described, an inert gas other than Ar gas such as $N_2$ gas or He gas may be used as the purge gas; and $H_2$ gas may be used as the purge gas.

Through the steps S1 to S4, a very conformal Cu film having excellent quality is formed. The steps S1 to S4 are repeated until a Cu film having a desired thickness is formed on the wafer W.

The Cu-carboxyl acid complex or a derivative thereof used as the source material gas in this process has high wettability to the base. In addition, since a gas of the Cu-carboxyl acid complex or a derivative thereof has a high vapor pressure, the gas can be used in high concentration. Thus, in the source material supplying step S1, the Cu-carboxyl acid complex or a derivative thereof can be adsorbed to the surface of the wafer W with high uniformity. Therefore, a smooth, continuous Cu film can be formed through the reduction reaction in the subsequent reductive gas supplying step S3. In addition, since ALD process is employed for the film deposition, a film with excellent quality and high thickness accuracy can be formed. When the PVD process is employed, conformal seed layers can not be formed in fine holes which are recently used. However, with this embodiment, a conformal Cu film with an extremely low thickness can be formed in fine holes.

Figure 3:
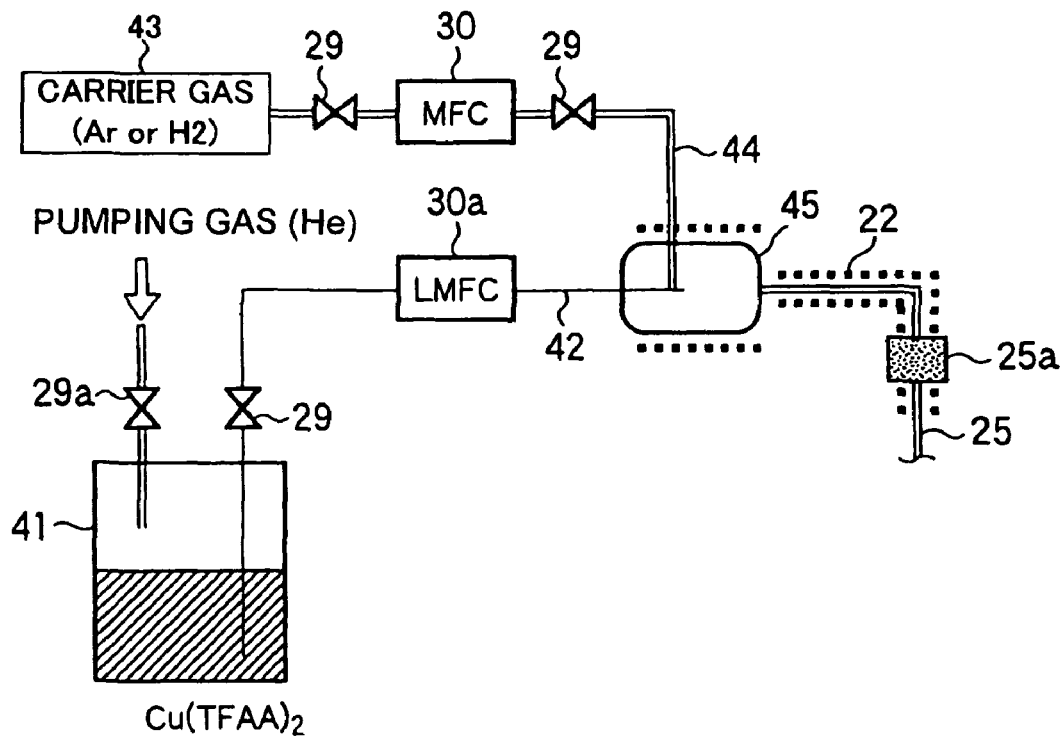
FIG. 3 is a piping diagram schematically showing a modification of a gas supply mechanism of the film deposition system shown in FIG. 1.

Although the solid $Cu(TFAA)_2$ is sublimated in the Cu-containing material source 21 in the foregoing embodiment, the $Cu(TFAA)_2$ may be gasified by using a vaporizer as shown in FIG. 3.

In the embodiment shown in FIG. 3, the Cu-containing material source 41 comprises a container such as a tank, in which $Cu(TFAA)_2$ as a Cu-containing source material is dissolved in a predetermined solvent such as hexane, n-hexane, octane, benzene, acetone, ethanol, or an acetic acid and is stored in a liquid state. When a pumping gas such as He gas is introduced into a Cu-containing material source 41, the $Cu(TFAA)_2$ is pumped through a pipe 42 inserted in the liquid stored in the Cu-containing material source 41. The valve 29 and a liquid mass flow controller 30a are provided on the pipe 42, and an end of the pipe 42 is connected to a vaporizer 45. A gas line 44 is connected to the vaporizer 45 to supply a carrier gas such as Ar or $H_2$ gas to the vaporizer 45 from the carrier gas source 43. Two valves 29 and a mass-flow controller 30 interposed between the valves 29 are provided on the gas line 44.

The vaporizer 45 vaporizes a liquid containing the $Cu(TFAA)_2$ pumped from the Cu-containing material source 41 through the pipe 42 by spraying the liquid with the use of the carrier gas that is supplied through the gas line 44, and send out the vapor as a source material gas to the gas line 25. By sending the Cu-containing source material by using the vaporizer 45, the Cu-containing source material can efficiently be vaporized and supplied as a source material gas into the chamber 1, so that the adsorption of the source material gas on the wafer W is readily saturated. The gas line 25 extending from the vaporizer 45 to the chamber 1 is heated by the heater 22 to prevent condensation of the source material gas.

Figure 2:
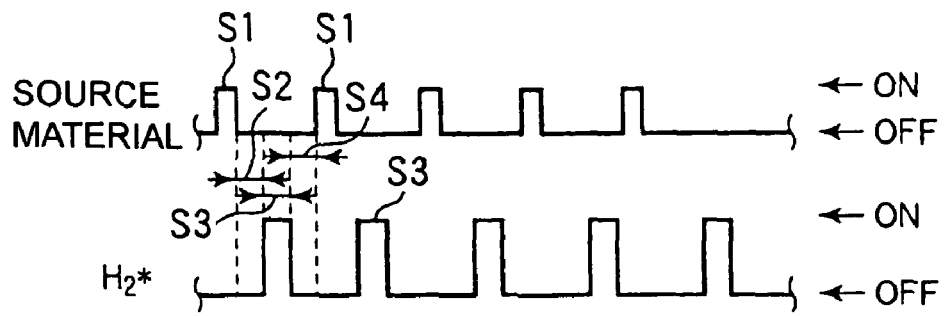
FIG. 2 is a timing chart showing an example of the gas-supply timing in a film deposition method according to the present invention.

In the embodiments shown in FIG. 1 to FIG. 3, $(Cu(TFAA)_2)$ is used as a Cu-carboxyl acid complex or a derivative thereof. Instead, copper acetate may be used.

Figure 4:
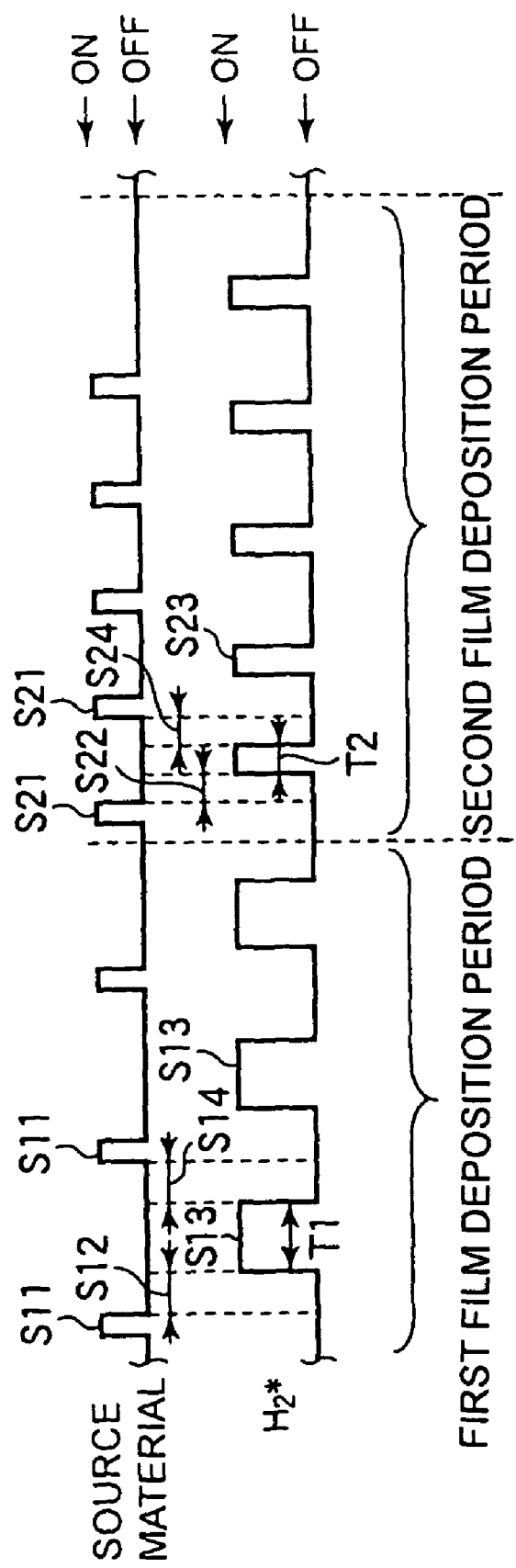
FIG. 4 is a timing chart showing another example of the gas-supply timing in the film deposition method according to the present invention.

Another embodiment of the film deposition method according to the present invention will be described with reference to FIG. 4. Also in the embodiment shown in FIG. 4, the same film deposition system as that shown in FIG. 1 may be used.

This embodiment solves the problem described in the Background Art that it is difficult to achieve improvement of the throughput of the process by shortening the reduction reaction time while achieving improvement in film quality if a Cu film is formed by an ALD process. In this embodiment, the period of time for the supply of a reductive gas in a first film deposition period in an early deposition stage is different from that in a second film deposition period following the early deposition stage which continues until a film with a required thickness is deposited. Due to this feature, this embodiment overcomes the foregoing technical problem in connection with the ALD process, and enables formation of a Cu film having excellent quality at high throughput.

In this embodiment, the C-containing source material is not limited, and β-diketone complex, a derivative thereof or acetate thereof, which has been used in the conventional technique, may be used. Examples of the Cu-containing source material include, for instance, [trimethylvinylsilyl] hexafluoro-acetyl-acetone copper (hereinafter referred to as "Cu(hfac)TVMS"), which is a derivative of the β-diketone complex; and a source material, which contains the above derivative as the main component and which is in a liquid state at room temperature and under atmospheric pressure (i.e., having a low saturated vapor pressure), may be used. Such a source material can be supplied to the chamber by using the source material supply system shown in FIG. 3.

At first, the wafer W is heated by the heater 5 to a temperature, at which the source material gas is not decomposed, in the range of 50 to 350° C., and more preferably in the range of 70 to 180° C.; and the chamber 1 is evacuated by the exhaust system 38 to maintain the interior of the chamber 1 at a pressure in the range of 10 to 1400 Pa, more preferably 10 to 200 Pa.

The Cu(hfac)TMVS used as the Cu-containing source material is vaporized in the vaporizer, and is supplied into the chamber 1, for instance, for a period of time in the range of 0.1 to 5 seconds at a flow rate in the range of 0.01 to 1 g/min so that the source material adsorbs to the entire surface of the wafer W (Source material supplying step S11). Then, the supply of the source material gas is stopped, and the chamber 1 is evacuated to remove the surplus source material gas remaining in the chamber 1 (Source material supply stopping and residual gas removing step S12). In this step, the residual gas may be removed by evacuating the chamber 1 with an inert gas as a purge gas being supplied into the chamber 1 to purge the same. An inert gas other than Ar gas such as $N_2$ gas or He gas may be used as the purge gas; and $H_2$ gas may be used as the purge gas.

Then, $H_2$ gas as a reductive gas is supplied from the $H_2$ gas source 24 at a flow rate in the range of, for instance, 100 to 5000 ml/min, and a radio-frequency power in the range of 50 to 2000 W, preferably of 100 to 1000 W is supplied from the radio-frequency power source 33. The frequency of the radio-frequency power may be, for instance, 13.56 MHz, but the frequency is not limited to this value. When the radio-frequency power is supplied, the $H_2$ gas is converted into plasma so that hydrogen radicals ($H_2^*$) are generated, and the Cu(hfac)TMVS adsorbed on the wafer W is reduced by the hydrogen radicals ($H_2^*$) (Reductive gas supplying step S13). The period of time of the reductive gas supply step S13 (i.e., the first period of time T1) is, for instance, in the range of 3 to 20 seconds.

Then, the supply of $H_2$ gas and application of the radio-frequency power are stopped, and the $H_2$ gas is removed from the interior of the chamber 1 by evacuating the chamber 1 (Reductive gas supply stopping and residual gas removing step S14). In this step, the residual gas may be removed by evacuating the chamber 1 with an inert gas as a purge gas being supplied into the chamber 1 to purge the same. An inert gas other than Ar gas such as $N_2$ gas or He gas may be used as the purge gas; and $H_2$ gas may be used as the purge gas.

In the step S13, the period of time T1 for supplying $H_2$ gas as a reductive gas is relatively long, such as 3 to 20 seconds. Thus, even if Cu(hfac)TMVS, which is a derivative of β-diketone complex and has low wettability to the base, is used as a source material, lowering of the adhesion of the Cu film or the surface roughness due to the presence of impurities such as carbon originating from the source material or due to oxidization of the base never occurs. Thus, a film with excellent quality can be assuredly obtained. For the reasons as described above, the steps S11 to S14 are repeated until the thickness of a Cu film becomes a value under which there is no possibility of lowering of adhesion of the Cu film or the noticeable surface roughness is eliminated, or until the Cu deposited on the base becomes a continuous film (i.e., until a region not covered with the Cu film disappears). The period until then is referred to as the first film deposition period.

In the second film deposition period following the first film deposition period, the film deposition process is further continued. In the second film deposition period, the Cu(hfac)TMVS is employed as a Cu-containing source material and is vaporized under the same conditions as those in the step S11. The vaporized source material is introduced into the chamber 1 and adsorbs to the entire surface of the wafer W (Source material supplying step S21). Then, the surplus source material gas is removed by evacuating the chamber 1 (Source material supply stopping and residual gas removing step S22).

Then, $H_2$ gas used as a reductive gas is supplied from the $H_2$ gas source 24 into the chamber 1 at a flow rate of in the range of, for instance, 100 to 5000 ml/min, and a radio-frequency power in the range of 50 to 2000 W, preferably of 100 to 1000 W is supplied from the radio-frequency power source 33. A frequency of the radio-frequency power is, for instance, 13.56 MHz, but the frequency is not limited to this value. When the radio-frequency power is supplied, the $H_2$ gas is converted into a plasma gas so that hydrogen radicals ($H_2^*$) are generated, and the Cu(hfac)TMVS adsorbed to the surface of the wafer W is reduced by the hydrogen radicals ($H_2^*$) (Reductive gas supplying step S23). The period of time for the reactive gas supply step S23 (i.e., the second period of time T2) is shorter than the period of time T1, such as 1 to 5 seconds. Then, the supply of $H_2$ gas and the application of the radio-frequency power are stopped and the $H_2$ gas is removed from the interior of the chamber 1 by evacuating the same (Reductive gas supply stopping and residual gas removing step S24). The removal of the surplus source material gas and the residual H radicals by evacuation can be performed effectively, if it is performed while supplying Ar, $N_2$, He, or $H_2$ gas into the chamber 1.

The steps S21 to S24 are repeated until a Cu film with a desired thickness is formed on the wafer W, and then the second film deposition period is finished.

As described above, with this embodiment, in the first film deposition period in the early deposition stage in which there is a possibility of lowering of the adhesion of the Cu film and noticeable surface roughness, the period of time T1 for supplying a reductive gas is set relatively long to form an initial film with excellent quality; and thereafter in the second film deposition period in which there is no possibility of the foregoing defects, the time T2 for supplying the reductive gas is set relatively short. Due to this feature, the total time required for the film deposition process can be shortened in correspondence to the shortened time for the reductive gas supply step in the second film deposition period. Therefore, a conformal film with excellent quality can be obtained at high throughput.

In the embodiment, in the first film deposition period and in the second film deposition period following the first period, the time T1 for supplying $H_2$ gas (reductive gas) in the first film deposition period is set longer than the time T2 for supplying the $H_2$ gas (reductive gas) in the second film deposition period, so that a Cu film with high adhesion to the base and low surface roughness can be obtained at high throughput.

The present invention is not limited to the foregoing embodiments, and various modifications can be applied thereto without departing from the gist of the present invention. For instance, although $H_2$ gas is used as a reductive gas in all the embodiments described above, a reductive gas other than the $H_2$ gas such as $NH_3$, hydrazine, $SiH_4$, $Si_2H_5$, dichlorosilane, diborane, or phosphine may be used in place of the $H_2$ gas.

In the foregoing embodiments, the reductive gas is converted into plasma gas by using radio-frequency energy for promoting reduction reaction of the source material. However, in a case where a reductive gas having high reducing capability is used, the reduction reaction of the source material may be promoted by using thermal energy generated by the heater 5 of the susceptor 2 for heating the wafer W, without using radio-frequency energy.

When the Cu-carboxyl acid complex or a derivative thereof is used as a source material, it is not absolutely necessary to employ the ALD process used in the forgoing embodiments. In this case, there may be employed a CVD process that simultaneously supplies a source material and a reductive gas into the chamber 1 and promotes reduction reaction by using radio-frequency energy or thermal energy.

In the foregoing embodiment, a plasma generator of a parallel-plate, capacitively-coupled type employing radio-frequency energy is used for generating plasma, but the plasma generator is not limited thereto. An inductively-coupled plasma generator (ICP) may be used. An ECR (Electron Cyclotron Resonance) plasma generator, or a microwave plasma generator using an RLSA (radial line slot antenna) may be used.

The invention claimed is:

1. A film deposition method that alternately performs a step of supplying a Cu-containing source material onto a substrate and a step of supplying a reductive gas to the substrate after stopping supplying the Cu-containing source material, wherein said method has:

a first film deposition period, in an early deposition stag; in which the two steps are performed alternately two or more times, and in which each step of supplying the reductive gas is performed for a first period of time T1; and a second film deposition period, following the first film deposition period, in which the two steps are performed alternately two or more times, and in which each step of supplying the reductive gas is performed for a second period of time T2 shorter than the period of time T1.

2. A film deposition method comprising the steps of:

placing a substrate in a process container; and repeating the following steps (a) to (d):

(a) supplying a Cu-containing source material onto the substrate;

(b) removing residual gases in the process container therefrom after stopping supplying the Cu-containing source material;

(c) supplying a reductive gas to the substrate; and (d) removing residual gases in the process container therefrom after stopping supplying the reductive gas, wherein said method has:

a first film deposition period, in an early deposition stage, in which the steps (a) to (d) are performed alternately two or more times, and in which each step of supplying the reductive gas is performed for a first period of time T1; and a second film deposition period, following the first film deposition period, in which the steps (a) to (d) are performed alternately two or more times, and in which each step of supplying the reductive gas is performed for a second period of time T2 shorter than the period of time T1.

3. The film deposition method according to claim 2, wherein the steps (b) and (d) are performed by replacing atmosphere in the process container with an inert gas, or by evacuating the processing container.

4. The film deposition method according to claim 1, wherein the first film deposition period continues until Cu deposited on the substrate becomes a continuous film, and the second film deposition period continues until a Cu film with a desired thickness is formed on the substrate.

5. The film deposition method according to claim 1, wherein the first period of time T1 is in a range of 3 to 20 seconds and the second period of time T2 is in a range of 1 to 5 seconds.

6. The film deposition method according to claim 1, wherein the reductive gas is converted into radicals by using plasma.

7. The film deposition method according to claim 1, wherein the reductive gas is $H_2$ gas.

8. The film deposition method according to claim 2, wherein the first film deposition period continues until Cu deposited on the substrate becomes a continuous film, and the second film deposition period continues until a Cu film with a desired thickness is formed on the substrate.

9. The film deposition method according to claim 2, wherein the first period of time T1 is in a range of 3 to 20 seconds and the second period of time T2 is in a range of 1 to 5 seconds.

10. The film deposition method according to claim 2, wherein the reductive gas is converted into radicals by using plasma.

11. The film deposition method according to claim 2, wherein the reductive gas is $H_2$ gas.

\* \* \* \* \*